(12) United States Patent
Chiang et al.

(10) Patent No.: US 10,965,306 B2
(45) Date of Patent: *Mar. 30, 2021

(54) SUCCESSIVE APPROXIMATION REGISTER ANALOG-TO-DIGITAL CONVERTER

(71) Applicant: Nuvoton Technology Corporation, Hsinchu Science Park (TW)

(72) Inventors: Che-Hao Chiang, Yuanlin (TW); Szu-Wei Chang, Taoyuan (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/553,605

(22) Filed: Aug. 28, 2019

(65) Prior Publication Data
US 2020/0076444 A1 Mar. 5, 2020

(30) Foreign Application Priority Data
Aug. 28, 2018 (TW) .................................. 107129971

(51) Int. Cl.
*H03M 1/12* (2006.01)
*H03M 1/46* (2006.01)

(52) U.S. Cl.
CPC .......... *H03M 1/462* (2013.01); *H03M 1/466* (2013.01)

(58) Field of Classification Search
CPC ...... H03M 1/462; H03M 1/466; H03M 1/468; H03M 1/12; H03M 1/00; H03M 1/802; H03M 1/804; H03M 1/806

USPC ......................................... 341/155, 161, 172
See application file for complete search history.

(56) References Cited

U.S. PATENT DOCUMENTS

| | | | | |
|---|---|---|---|---|
| 6,927,723 B2* | 8/2005 | Nomasaki | ............ | H03M 1/124 341/155 |
| 7,928,880 B2* | 4/2011 | Tsukamoto | ......... | H03M 1/1061 341/144 |
| 8,860,600 B1* | 10/2014 | Yang | .................... | H03M 1/466 341/172 |

(Continued)

OTHER PUBLICATIONS

Office Action of U.S. Appl. No. 16/533,245, dated Feb. 13, 2020, 11 pages.

*Primary Examiner* — Jean B Jeanglaude
(74) *Attorney, Agent, or Firm* — Muncy, Geissler, Olds and Lowe, P.C.

(57) ABSTRACT

A successive approximation register analog-to-digital converter includes a comparator circuit, a capacitor group, an additional capacitor and a control circuit. The comparator circuit compares voltages at first and second input terminals thereof to generate a comparison result. The capacitor group and the additional capacitor are coupled to the first input terminal. The control circuit controls voltages of capacitors of the capacitor group according to the comparison result. In a first period, the control circuit provides a first voltage to the first input terminal and the additional capacitor, and provides an analog signal to the capacitors. In a second period, the control circuit stops providing the first voltage and controls a specific capacitor of the capacitor group to enter into a floating state. In a third period, the control circuit provides a second voltage to the additional capacitor. The second voltage is lower than the first voltage.

17 Claims, 10 Drawing Sheets

(56) References Cited

U.S. PATENT DOCUMENTS

| | | | |
|---|---|---|---|
| 2010/0039303 A1* | 2/2010 | Tsukamoto | H03M 1/1061 |
| | | | 341/150 |
| 2015/0054668 A1* | 2/2015 | van der Goes | H03M 1/002 |
| | | | 341/172 |
| 2015/0184432 A1* | 7/2015 | Janssen | E05B 81/15 |
| | | | 292/200 |
| 2018/0337688 A1* | 11/2018 | Huang | H03M 1/68 |
| 2019/0131991 A1* | 5/2019 | Hsu | H03M 1/466 |

* cited by examiner

SUCCESSIVE APPROXIMATION REGISTER ANALOG-TO-DIGITAL CONVERTER

CROSS-REFERENCE TO RELATED APPLICATION

This application claims the benefit of Taiwan Patent Application No. 107129971, filed on Aug. 28, 2018, in the Taiwan Intellectual Property Office, the disclosure of which is incorporated herein in its entirety by reference.

BACKGROUND OF THE INVENTION

1. Field of the Invention

The present invention relates to an analog-to-digital converter, more particularly to a successive approximation register analog-to-digital converter.

2. Description of the Related Art

With advance of technology, electronic products are various and have more functions. For most of the electronic products, analog-to-digital converters are necessary components configured to convert analog signals into digital signals for other components to use.

SUMMARY OF THE INVENTION

The present invention provides a successive approximation register analog-to-digital converter comprising a comparator circuit, a capacitor group, an additional capacitor and a control circuit. The comparator circuit comprises a first input terminal and a second input terminal, and is configured to compare the voltages at the first and second input terminals, to generate a comparison result. The capacitor group comprises a plurality of capacitors coupled to the first input terminal. The additional capacitor is coupled to the first input terminal. The control circuit controls the voltages of the plurality of capacitors according to the comparison result. In a first period, the control circuit provides a first voltage to the first input terminal and the additional capacitor, and provides an analog signal to the plurality of capacitors of the capacitor group. In a second period, the control circuit stops providing the first voltage to the first input terminal, and controls a specific capacitor of the capacitor group to enter into a floating state. In a third period, the control circuit provides a second voltage to the additional capacitor. The second voltage is lower than the first voltage.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

The following embodiments of the present invention are herein described in detail with reference to the accompanying drawings. These drawings show specific examples of the embodiments of the present invention. It is to be understood that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be understood that although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be understood to imply the inclusion of stated elements but not the exclusion of any other elements.

Figure 1:
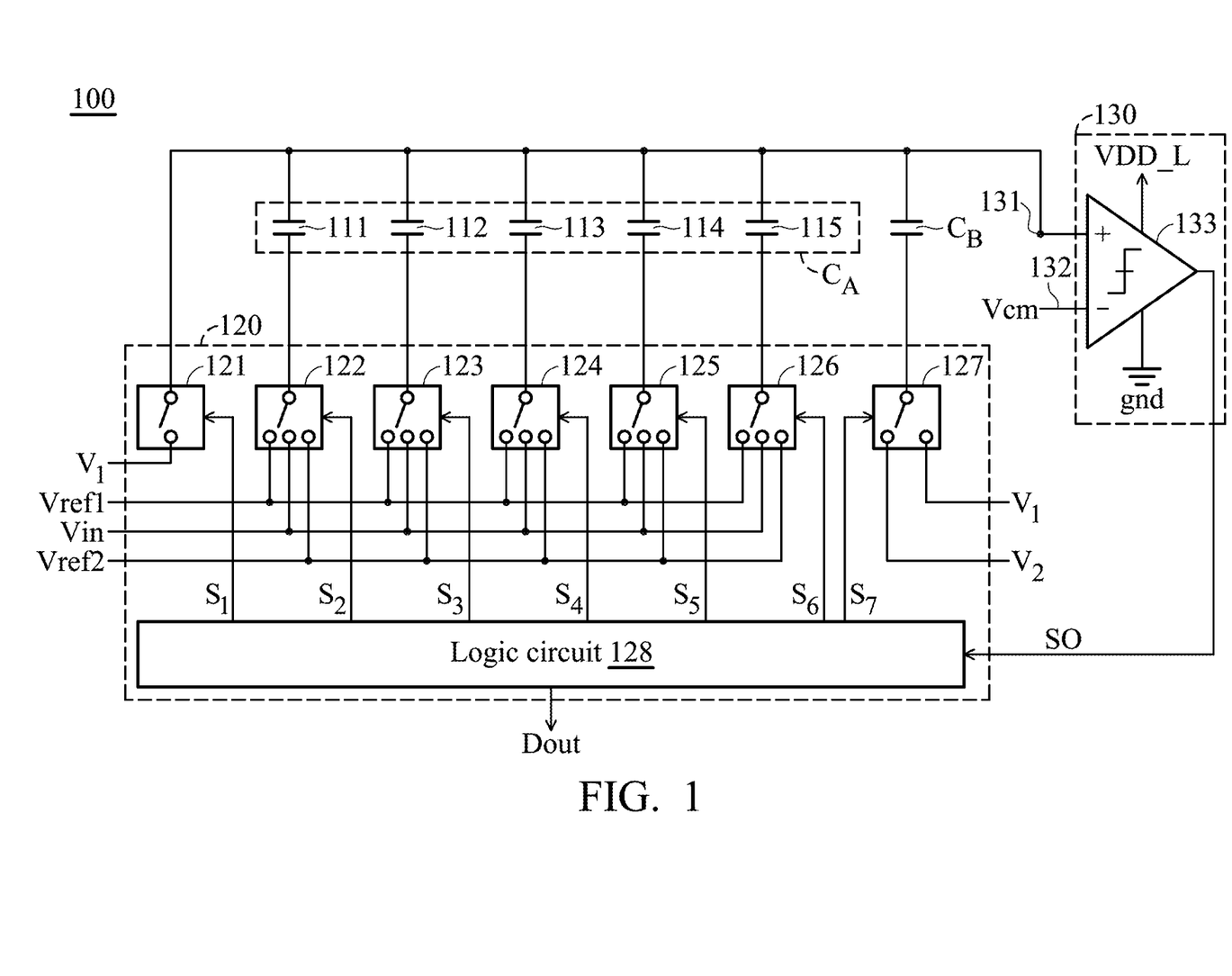
FIG. 1 is a schematic view of an embodiment of a successive approximation register analog-to-digital converter of the present invention.

FIG. 1 is a schematic view of an embodiment of a successive approximation register analog-to-digital converter of the present invention. The successive approximation register analog-to-digital converter 100 can convert an analog signal Vin into a digital signal Dout. As shown in FIG. 1 the successive approximation register analog-to-digital converter 100 comprises a capacitor group CA, an additional capacitor CB, a control circuit 120 and a comparator circuit 130.

In this embodiment, the capacitor group $C_A$ includes capacitors 111 to 115; however, the present invention is not limited to above example. In other embodiment, the capacitor group $C_A$ can include more or less capacitors. Each of the capacitors 111 to 115 includes a first terminal coupled to the input terminal 131 of the comparator circuit 130, and a second terminal coupled to the control circuit 120. In this embodiment, the capacitance values of capacitors 111 to 115 are in a multiple relationship. For example, the capacitance value of the capacitor 111 is two times of that of the capacitor 112, the capacitance value of the capacitor 112 is two times of that of the capacitor 113, the capacitance value of the capacitor 113 is two times of that of the capacitor 114, and the capacitance value of the capacitor 114 is two times of that of the capacitor 115.

The additional capacitor $C_B$ includes a first terminal coupled to the input terminal 131 and a second terminal coupled to the control circuit 120. In this embodiment, the capacitance value of the additional capacitor $C_B$ is lower than a sum of the capacitance values of the capacitors 111 to 115. In an embodiment, the capacitance value of the additional capacitor $C_B$ is lower than that of the capacitor 111. Among the capacitor group $C_A$, the capacitor 111 has the maximal capacitance value. In other embodiment, the capacitance value of the additional capacitor $C_B$ can be about equal to a sum of the capacitance values of the capacitors 113 to 115.

The comparator circuit 130 includes input terminals 131 and 132, and is configured to compare the voltages at the input terminals 131 and 132, so as to generate a comparison result SO. In this embodiment, the input terminal 132 can receive a common-mode voltage Vcm; however, the present invention is not limited to above example. In other embodiment, the input terminal 132 can receive a ground voltage. In this embodiment, the comparator circuit 130 can be implemented by a comparator 133, and a non-inverting input terminal of the comparator 133 can serve as the input terminal 131, and an inverting input terminal of the comparator 133 can serve as the input terminal 132. When receiving operating voltages VDD_L and gnd, the comparator 133 starts to compare the voltages at the input terminals 131 and 132. In an embodiment, the operating voltage VDD_L can be higher than the operating voltage gnd. In other embodiment, the operating voltage VDD_L can be about 1.2V, 1.5V, or 1.8V, and the operating voltage gnd can be a ground voltage.

The control circuit 120 controls the voltages at the second terminals of the capacitors 111 to 115 and the additional capacitor $C_B$ according to the comparison result SO. In this embodiment, the control circuit 120 can control the voltage at the input terminal 131. The structure of the control circuit 120 of the present invention is not limited to this example, and in an embodiment, the control circuit 120 can comprise switches 121 to 127 and a logic circuit 128.

The switch 121 is coupled to the input terminal 131, and configured to transmit a voltage V1 to the input terminal 131 according to a switching signal S1. The switch 122 is electrically connected to the capacitor 111 in series, and configured to transmit a reference voltage Vref1, Vref2, or the analog signal Vin to the capacitor 111, according to the switching signal S2. In an embodiment, the reference voltage Vref1 can be higher than the reference voltage Vref2. For example, the reference voltage Vref1 can be about 3V or 5V. In other embodiment, the reference voltage Vref2 can be about equal to the operating voltage gnd.

The switch 123 is electrically connected to the capacitor 112 in series, and configured to transmit the reference voltage Vref1, Vref2, or the analog signal Vin to the capacitor 112, according to the switching signal S3. The switch 124 is electrically connected to the capacitor 113 in series, and configured to transmit the reference voltage Vref1, Vref1, or the analog signal Vin to the capacitor 113, according to the switching signal S4. The switch 125 is electrically connected to the capacitor 114 in series, and configured to transmit the reference voltage Vref1, Vref1, or the analog signal Vin to the capacitor 114, according to the switching signal S5. The switch 126 is electrically connected to the capacitor 115 in series, and configured to transmit the reference voltage Vref1, Vref2, or the analog signal Vin to the capacitor 115, according to the switching signal S6. The switch 127 is electrically connected to the additional capacitor $C_B$ in series, and configured to transmit the voltage V1 or V2 to the additional capacitor $C_B$ according to the switching signal S7.

The logic circuit 128 generates the switching signals S1 to S7 and the digital signal Dout according to the comparison result SO. The digital signal Dout includes a plurality of bits, and when a number of the bits of the digital signal Dout is more, a resolution of the successive approximation register analog-to-digital converter 100 is higher. In an embodiment, the number of the bits of the digital signal Dout is relevant to a number of the capacitors of the capacitor group $C_A$. For example, the number of the bits of the digital signal Dout can be equal to the number of the capacitors of the capacitor group $C_A$; however, the circuit architecture of the logic circuit 128 of the present invention is not limited to above-mentioned example. In an embodiment, the logic circuit 128 can be operated in a sampling mode or a data converting mode according to an external signal which is not shown in FIG. 1.

FIGS. 2A to 2F are schematic views of operations of the successive approximation register analog-to-digital converter 100. For convenience in explanation, FIGS. 2A to 2F merely show the switch 121 to 127, the capacitors 111 to 115, and the additional capacitor CB inside the control circuit 120. Please refer to FIG. 2A, the control circuit 120 is operated in the sampling mode; in a first period, the control circuit 120 provides a voltage V1 to the input terminal 131 and the additional capacitor $C_B$, and provides an analog signal Vin to the capacitors 111 to 115. In this embodiment, the switch 121 transmits the voltage V1 to the input terminal 131, and the switches 122 to 126 transmit the analog signal Vin to the capacitors 111 to 115. In the first period, the switch 127 transmits the voltage V1 to the additional capacitor CB. In an embodiment, the voltage V1 is about equal to the operating voltage VDD_L. In other embodiment, the maximal amplitude of the analog signal Vin can be up to 3V or 5V.

Figure 2A:
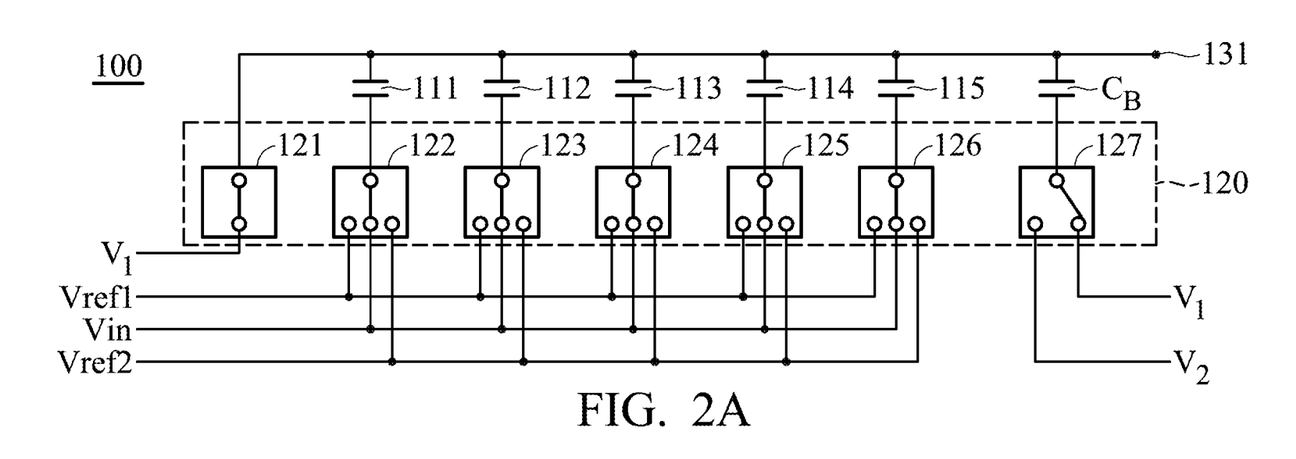
FIGS. 2A to 2F are schematic views of an operation of an embodiment of a successive approximation register analog-to-digital converter of the present invention.
Figure 2B:
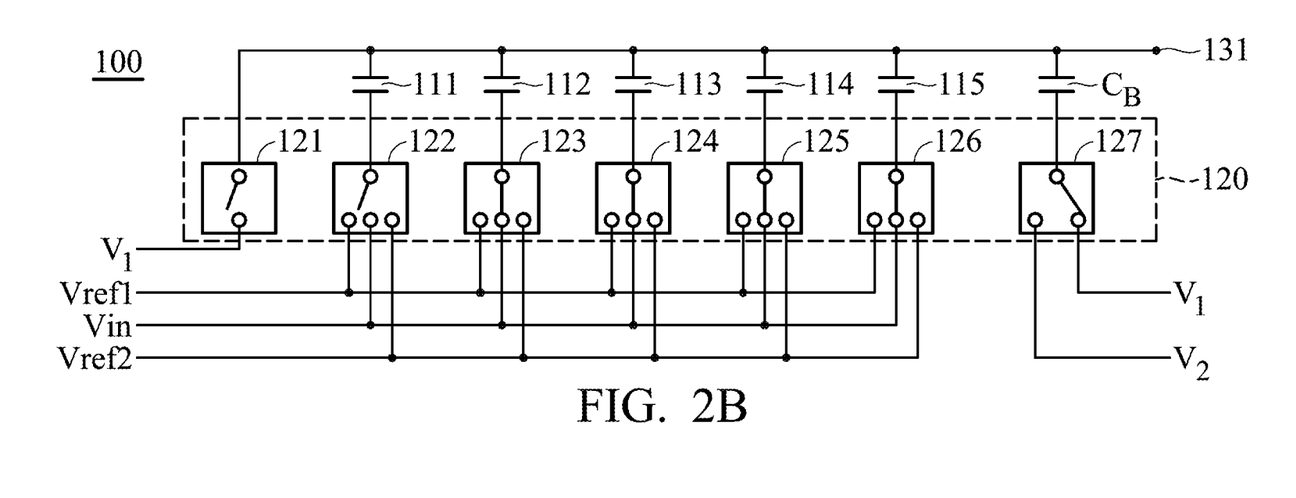

Please refer to FIG. 2B. In a second period of the sampling mode, the control circuit 120 stops providing the voltage V1 to the input terminal 131, and controls the first specific capacitor of the capacitors 111 to 115 to enter into a floating state. In an embodiment, the control circuit 120 continuously provides the analog signal Vin to the capacitors, which are other than the first specific capacitor, of the capacitors 111 to 115. For convenience in explanation, it is assumed that the control circuit 120 controls the capacitor 111, which is also called as first specific capacitor, to enter into the floating state. In this example, the switch 122 does not provide any voltage to the capacitor 111, so the capacitor 111 enters into the floating state. At this time, the switches 123 to 126 continuously transmit the analog signal Vin to the capacitors 112 to 115, and the switch 121 stops providing the voltage V1 to the input terminal 131. In other embodiment, in the second period, the control circuit 120 may control a plurality of capacitors to enter into the floating state, for example, the capacitors 111 and 112 enter into the floating state. The illustration about the control circuit 120 controlling a plurality of capacitors to enter into a floating state is described below, with reference to FIGS. 3A to 3F.

In some embodiments, the capacitance value of the additional capacitor $C_B$ is lower than or equal to the maximal capacitor value of the capacitor not being electrically floated. For example, when the control circuit 120 controls the capacitor 111 to enter into the floating state, the capacitance value of the additional capacitor $C_B$ is lower than or equal to the capacitance value of the capacitor 112. In other embodiments, when the control circuit 120 controls the capacitors 111 and 112 to enter into the floating state, the capacitance value of the additional capacitor CB is lower than or equal to the capacitance value of the capacitor 113.

Figure 2C:
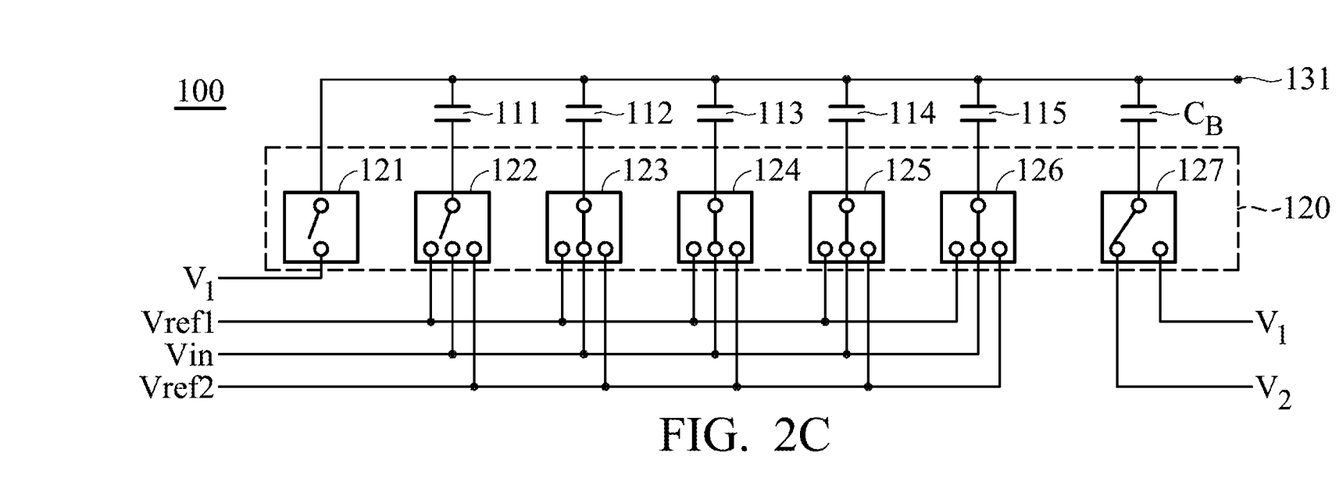

Please refer to FIG. 2C. In a third period of the sampling mode, the control circuit 120 provides the voltage V2 to the additional capacitor $C_B$. In this period, the control circuit 120 continuously provides the analog signal Vin to the capacitors, which are not electrically floated, of the capacitors 111 to 115, for example, the capacitors 112 to 115 are not electrically floated. However, the control circuit 120 does not transmit the voltage V1 to the input terminal 131, and continuously controls the capacitor 111 to stay in the floating state. In this embodiment, the switch 121 does not transmit the voltage V1 to the input terminal 131, and the switch 122 does not transmit any voltage to the capacitor 111, the switches 123 to 126 transmit the analog signal Vin to the capacitors 112 to 115, and the switch 127 transmits the voltage V2 to the additional capacitor $C_B$.

Figure 2D:
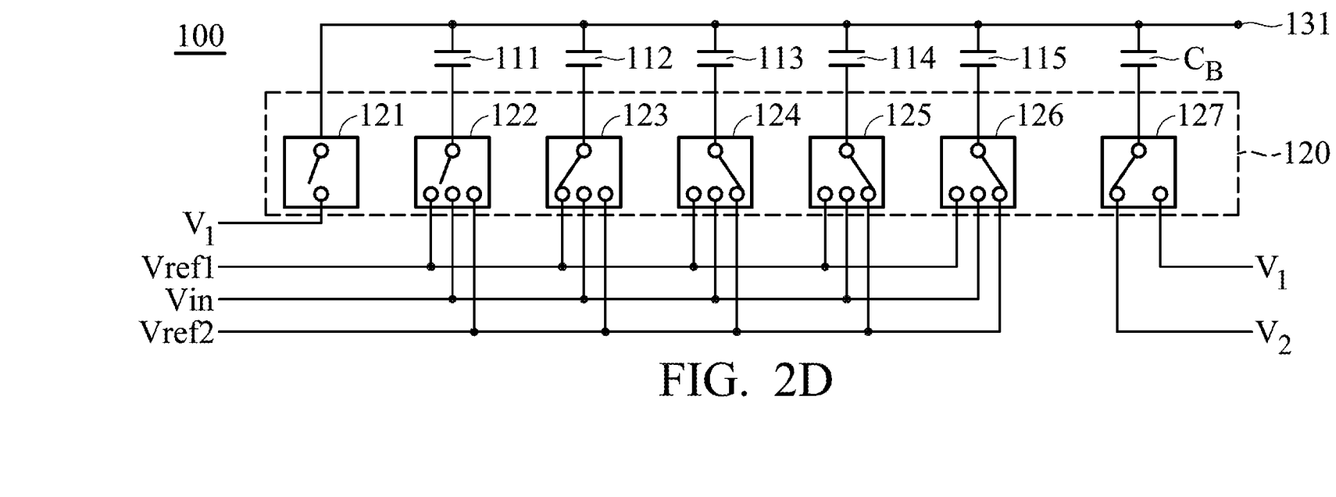

Please refer to FIG. 2D. When the control circuit 120 leaves from the sampling mode and enters into the data converting mode, it can be called as fourth period hereafter, the control circuit 120 can estimate the voltage of the capacitor being in the floating state, according to the voltage of the capacitor not being floated. In the present invention, the manner of estimating the voltage of the capacitor being in the floating state is not limited to above example. In an embodiment, the control circuit 120 provides the reference voltage Vref1 to the capacitor not being floated, and provides the reference voltage Vref2 to the other capacitor not being floated.

For example, the control circuit 120 can control the capacitor 111 to enter into the floating state. In this example, the control circuit 120 can provide the reference voltage Vref1 to the capacitor 112, which is also called as second specific capacitor hereafter, and also provides the reference voltage Vref2 to the capacitors 113 to 115. Next, the comparator circuit (not shown in figures) generates the comparison result according to the voltage at the input terminals 131 and 132, and this comparison result can be called as a first comparison signal hereafter. In the present invention, the manner used by the comparator circuit to compare the voltage at the input terminals 131 and 132 to generate the comparison result is not limited to above example. In an embodiment, when the voltage at the input terminal 131 is higher than the voltage at the input terminal 132, the comparator circuit can output the comparison result with a first voltage level (such as a high level); when the voltage at the input terminal 131 is lower than the voltage at the input terminal 132, the comparator circuit can output the comparison result with a second voltage level (such as a low level).

Figure 2E:
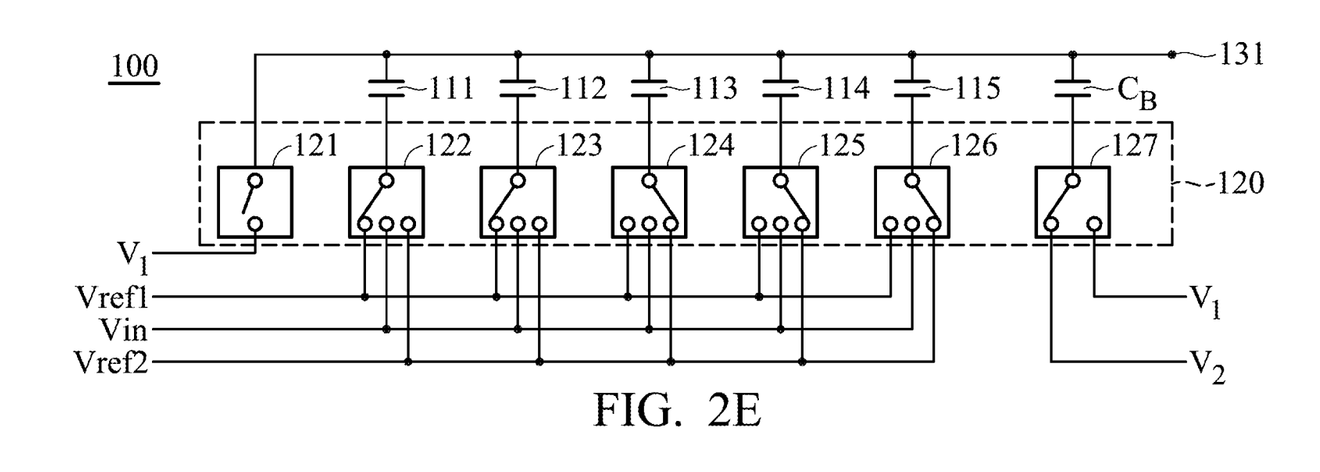

Please refer to FIG. 2E. The control circuit 120 provides the reference voltage Vref1 or Vref2 to the capacitor 111 according to the first comparison signal, which is also called as the first specific capacitor. For example, when the first comparison signal is at a first voltage level, the control circuit 120 provides the reference voltage Vref1 to the capacitor 111; when the first comparison signal is at a second voltage level, the control circuit 120 provides the reference voltage Vref2 to the capacitor 111. For convenience in explanation, it is assumed that the first comparison signal is at the first voltage level, and the control circuit 120 provides the reference voltage Vref1 to the capacitor 111.

Next, the control circuit 120 reads the voltages stored in the capacitors 112 to 115, in a sequential order. In an embodiment, the control circuit 120 can provide the reference voltage Vref1 to the capacitor 112, which is also called as second specific capacitor hereafter, and the control circuit 120 can provide the reference voltage Vref2 to the capacitors (such as the capacitors 113 to 115) other than the first and second specific capacitors. The comparator circuit can generate a second comparison signal according to the voltages at the input terminals 131 and 132.

Figure 2F:
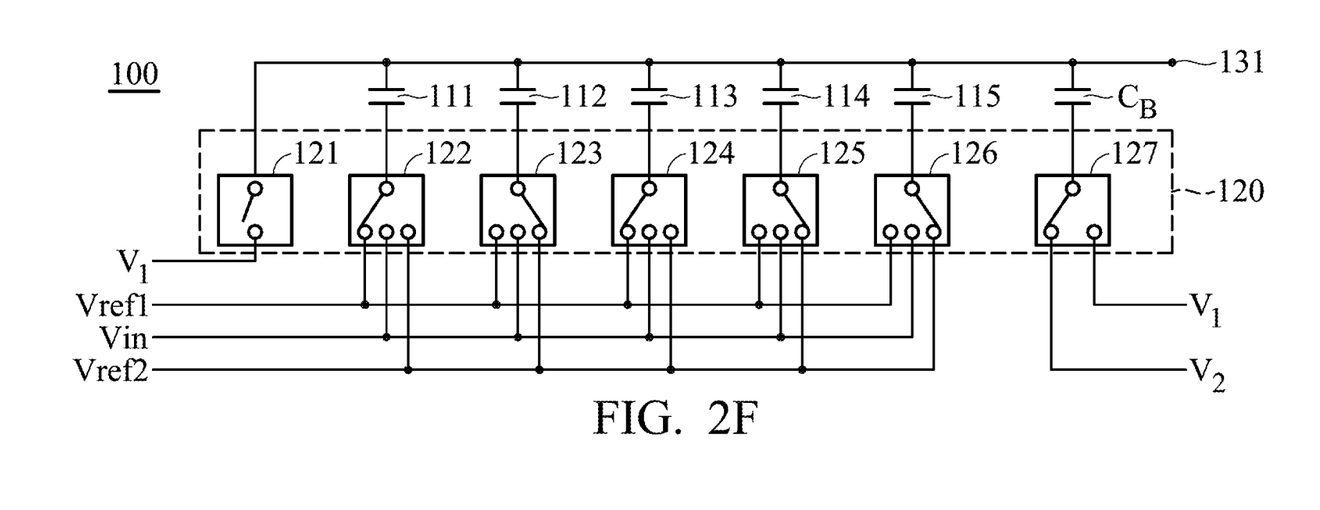

The control circuit 120 provides the reference voltage Vref1 or Vref2 to the capacitor 112 according to second comparison signal. It is assumed that the second comparison signal is at the second voltage level. The control circuit 120 provides the reference voltage Vref2 to the capacitor 112. Next, the control circuit 120 provides the reference voltage Vref1 to the capacitor 113, which is also called as third specific capacitor hereafter, and the control circuit 120 provides the reference voltage Vref2 to the capacitors (such as the capacitors 114 and 115), other than the first, second and third specific capacitors, of the first capacitor group, for determining the voltage of the capacitor 113. The comparator circuit generates a third comparison signal according to the voltages at the input terminals 131 and 132. The control circuit 120 provides the reference voltage Vref1 or Vref2 to the capacitor 113 according to a third comparison signal, and continuously reads the voltage stored in the capacitors 114 and 115. Since the manner used by the control circuit 120 to read the voltage stored in the capacitors 114 and 115 is the same as the manner used by the control circuit 120 to read the voltage stored in the capacitor 112, so the detailed description is not repeated.

Since the control circuit 120 appropriately controls the voltage at the input terminal 131 and the additional capacitor $C_B$ in the sampling period, the common-mode voltage can be generated at, the input terminal 131 without additionally using a reference voltage generator. Furthermore, the additional capacitor CB can reduce the voltage at the input terminal 131, so it is not necessary to use high-voltage device in the present invention. Furthermore, since the control circuit 120 controls the capacitor having the maximal capacitance to enter into the floating state, the resolution of the successive approximation register analog-to-digital converter 100 can be maintained effectively.

Figure 3A:
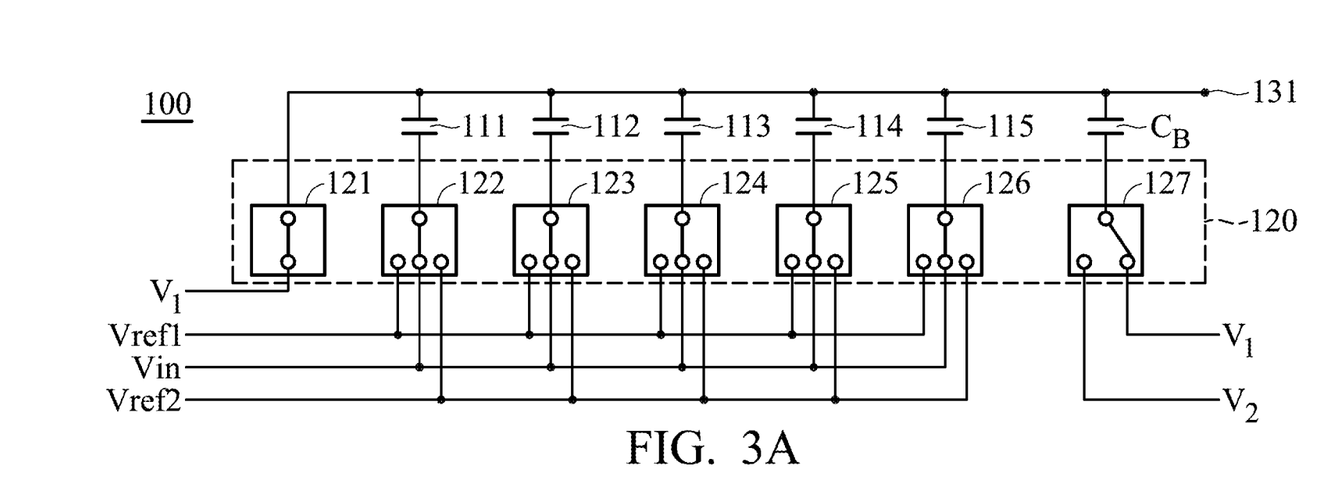
FIGS. 3A to 3F are schematic views of other operation of an embodiment of a successive approximation register analog-to-digital converter of the present invention.
Figure 3B:
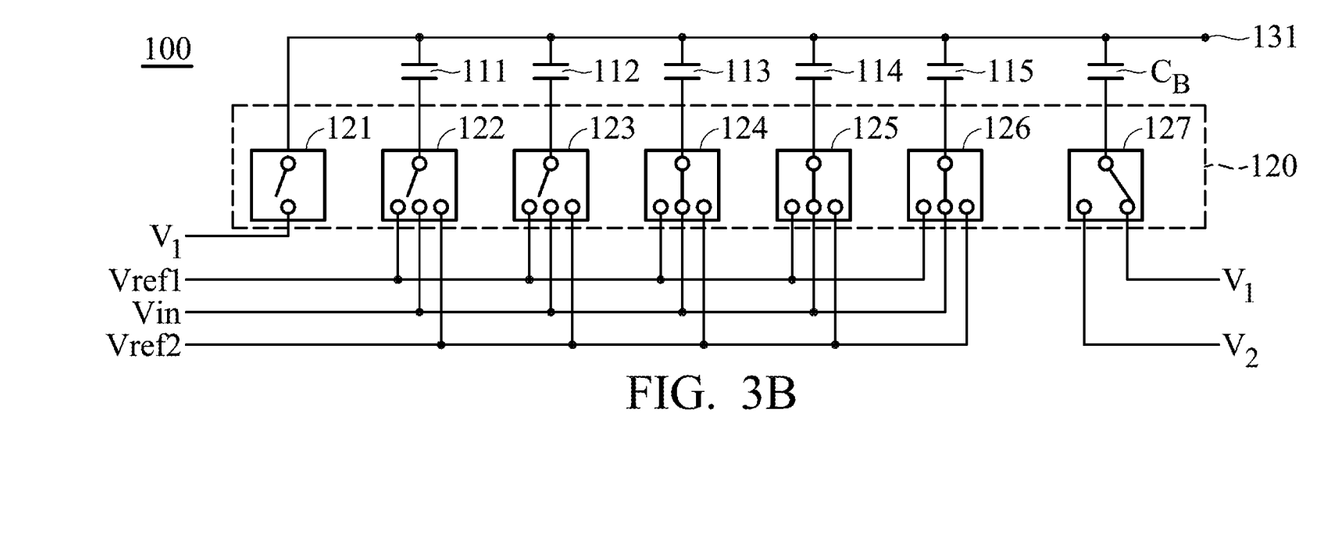
Figure 3C:
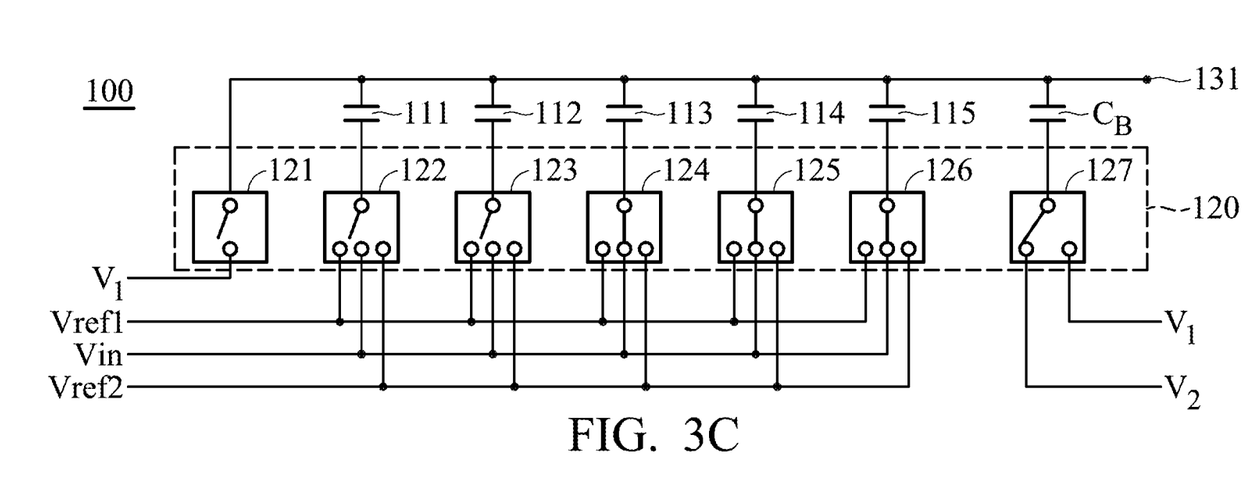

FIGS. 3A to 3F are schematic views of other operation of the successive approximation register analog-to-digital converter of the present invention. As shown in FIGS. 3A to 3C, the successive approximation register analog-to-digital converter 100 is operated in the sampling mode. Please refer to FIG. 3A, in a first period, the control circuit 120 provides a voltage V1 to the input terminal 131 and the additional capacitor $C_B$, and provides an analog signal Vin to the capacitors 111 to 115.

Please refer to FIG. 3B. In a second period, the control circuit 120 stops providing the voltage V1 to the input terminal 131. At this time, the control circuit 120 controls multiple capacitors of the capacitors 111 to 115, to enter into the floating state, and continuously provides the analog signal Vin to the capacitors, not entering into the floating state, of the capacitors 111 to 115. It is assumed that the control circuit 120 controls the capacitors 111 and 112 to enter into the floating state. In this example, the switches 122 and 123 does not provide any voltage to the capacitors 111 and 112. The capacitors 111 and 112 are at electrically-floating state; at this time, the switches 124 to 126 continuously transmit the analog signal yin to the capacitors 113 to 115, and the switch 121 stops providing the voltage V1 to the input terminal 131. In an embodiment, the control circuit 120 continuously provides the voltage V1 to the additional capacitor $C_B$.

Please refer to FIG. 3C. In a third period, the control circuit 120 provides the voltage V2 to the additional capacitor $C_B$. At this time, the control circuit 120 does not provide voltage V1 to the input terminal 131, and continuously controls the capacitors 111 and 112 to enter into the floating state. In this embodiment, the switches 124 to 126 provide the analog signal Vin to the capacitors 113 to 115.

Figure 3D:
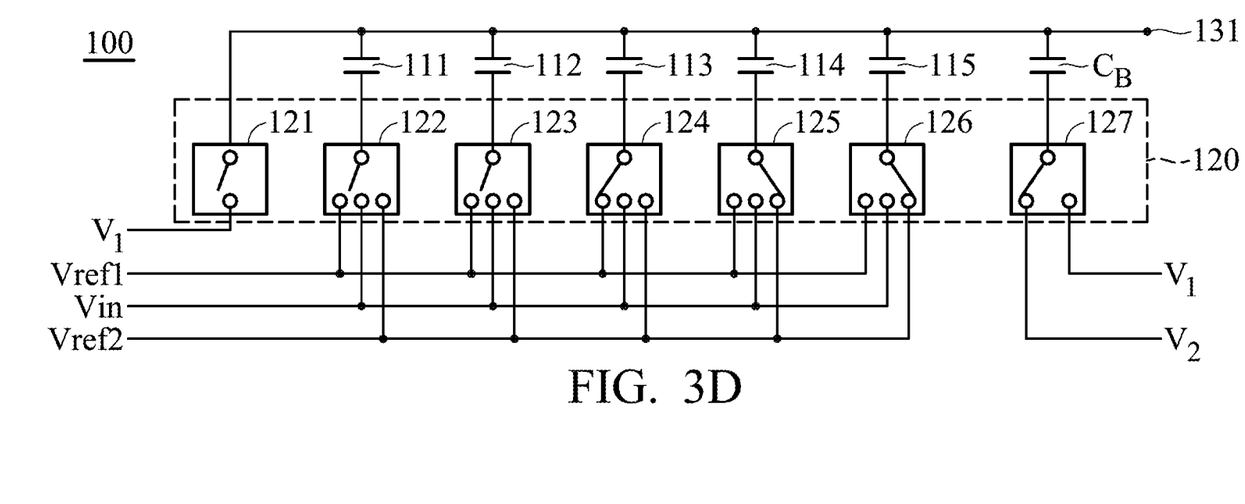
Figure 3E:
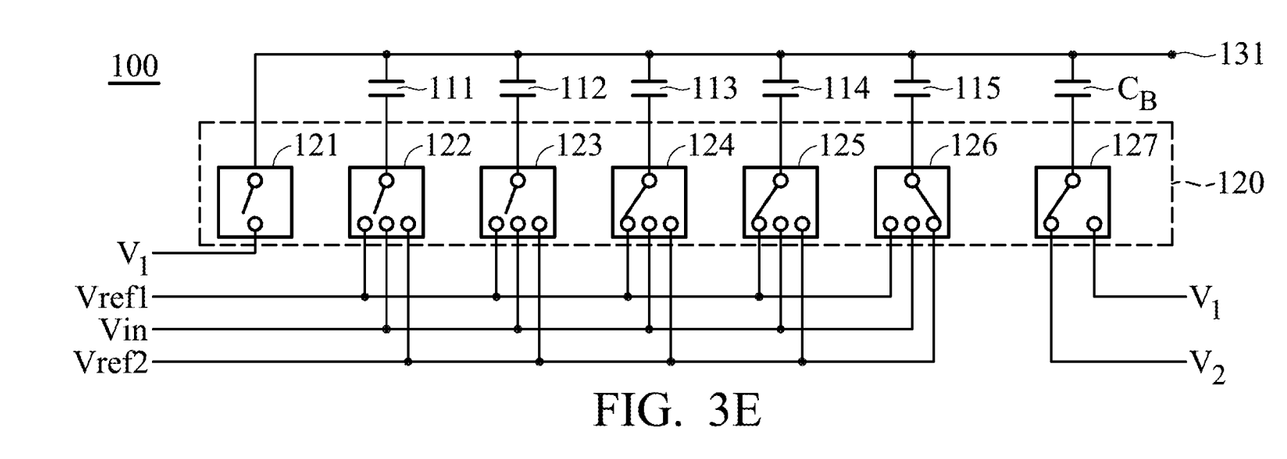
Figure 3F:
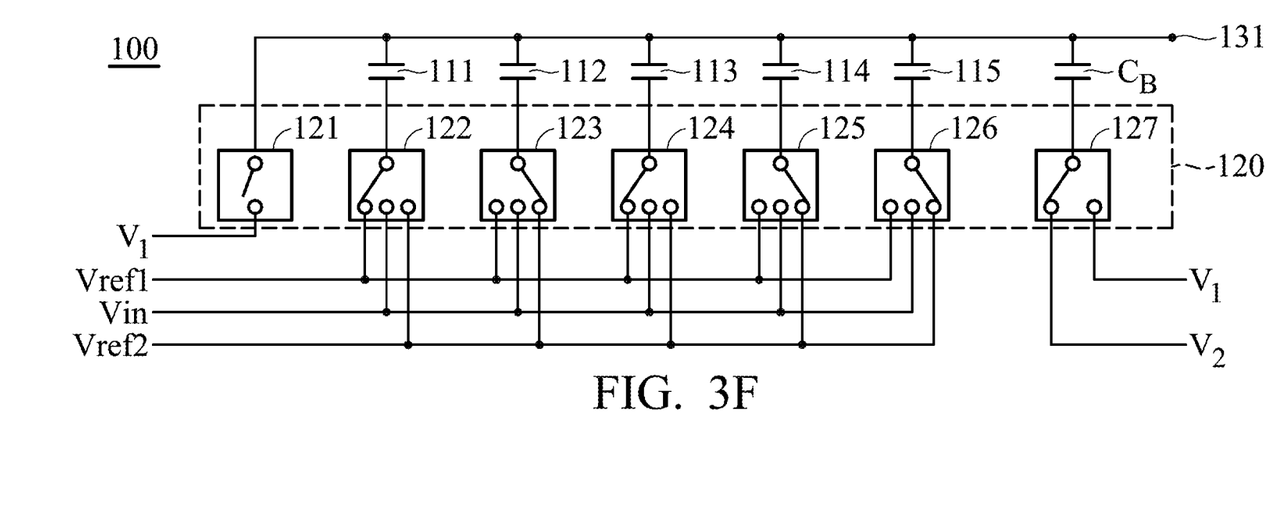

In FIGS. 3D to 3F, the control circuit 120 is operated in the data converting mode. In the data converting mode, the control circuit 120 estimates the voltage of the floated capacitor according to the voltages of the capacitors not being floated. In this embodiment, since the control circuit 120 floats the two capacitors, such as the capacitors 111 and 112, the control circuit 120 can estimate the voltages of the capacitors 111 and 112 according to the voltage of the capacitor not being floated. In other embodiment, when the control circuit 120 merely floats a capacitor, the control circuit 120 can estimate the voltage of the floated capacitor according to the voltage of the capacitor not being floated.

Please refer to FIG. 3D. The control circuit 120 provides the reference voltage Vref1 to the capacitor 113, and provides the reference voltage Vref2 to the capacitors 114 and 115. In this example, the comparator circuit (not shown in figures) can generate the comparison result, which is called as the first comparison signal hereafter, according to the voltages at the input terminals 131 and 132. The control circuit 120 provides the reference voltage Vref1 or Vref2 to the capacitor 113 according to the comparison result.

Please refer to FIG. 3E. It is assumed that the first comparison signal is at the first voltage level (such as a high voltage level). The control circuit 120 provides the reference voltage Vref1 to the capacitor 113. In this example, the control circuit 120 provides a reference voltage Vref1 to the capacitor 114, and provides the reference voltage Vref2 to the capacitor 115. In this example, the comparator circuit (not shown in figures) generates a new comparison result which is also called as second comparison signal hereafter, according to the voltages at the input terminals 131 and 132.

The control circuit 120 provides an appropriate voltage to the capacitors 111 and 112 according to first and second comparison signals. Please refer to FIG. 3F. It is assumed that the first comparison signal is at the first voltage level (such as a high voltage level), and the second comparison signal is at the second voltage level (such as a low voltage level). The control circuit 120 provides the reference voltage Vref1 to the capacitor 111, and provides the reference voltage Vref2 to the capacitor 112.

After the voltage of the floated capacitor is estimated, the control circuit 120 starts to read the voltage of the capacitor not being floated. In this embodiment, the control circuit 120 reads the voltage of the capacitor 113 first. The control circuit 120 provides a reference voltage Vref1 to the capacitor 113, and provides the reference voltage Vref2 to the capacitors 114 and 115. The comparator circuit generates a comparison result according to the voltages at the input terminals 131 and 132, and this comparison result is also called as third comparison signal hereafter. The control circuit 120 provides the reference voltage Vref1 or Vref2 to the capacitor 113 again according to the third comparison signal, and reads the voltages of the capacitors 114 and 115, in a sequential order. Since the manner of reading the voltage of the capacitor 114 and 115 is the same as the manner of reading the voltage of the capacitor 113, so the detailed description is not repeated.

Figure 4:
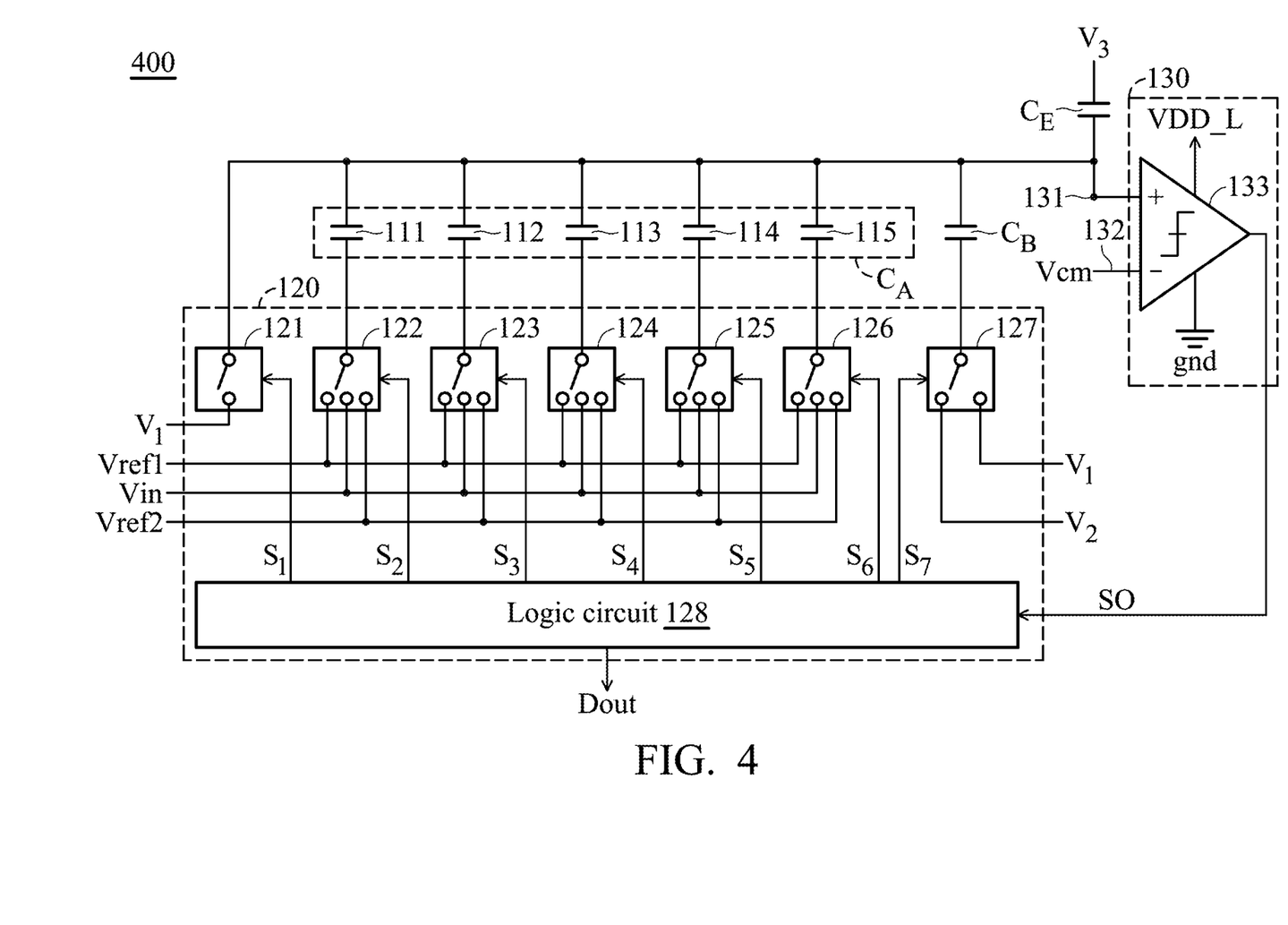
FIG. 4 is a schematic view of other embodiment of a successive approximation register analog-to-digital converter of the present invention.

FIG. 4 is a schematic view of other embodiment of the successive approximation register analog-to-digital converter of the present invention. The embodiment shown in FIG. 4 is similar to the embodiment shown in FIG. 1, and the difference between these two embodiments is that the successive approximation register analog-to-digital converter 400 shown in FIG. 4 includes an additional capacitor $C_E$. The additional capacitor $C_E$ is coupled to the input terminal 131, and can receive a voltage V3. In an embodiment, the voltage V3 is about equal to the voltage V2. In this embodiment, the additional capacitor $C_E$ is configured to change the voltage of the input terminal 131.

Figure 5:
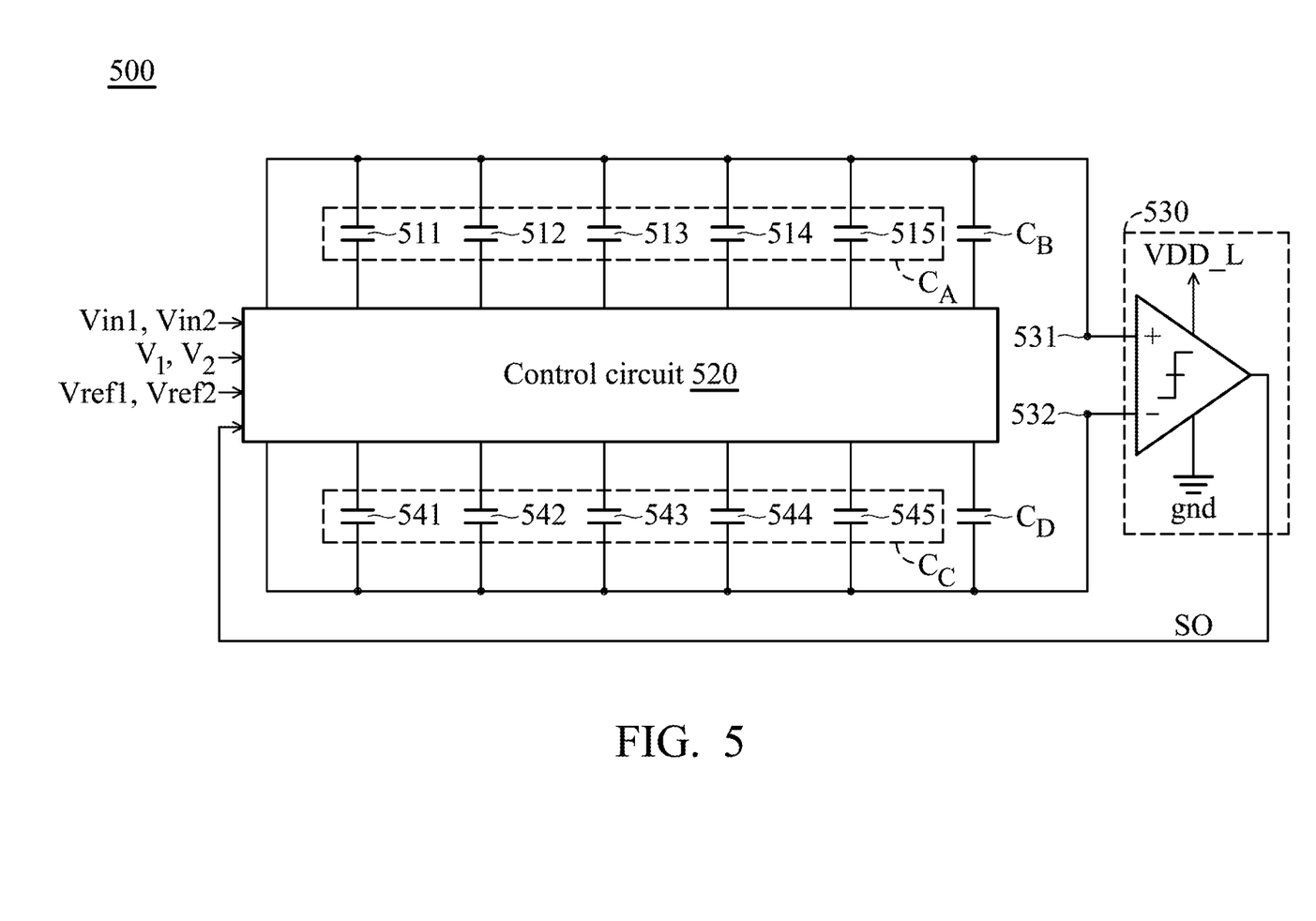
FIG. 5 is a schematic view of other embodiment of a successive approximation register analog-to-digital converter of the present invention.

FIG. 5 is a schematic view of other embodiment of the successive approximation register analog-to-digital converter of the present invention. The embodiment shown in FIG. 5 is similar to the embodiment shown in FIG. 1, and the difference between these two embodiments is that the successive approximation register analog-to-digital converter 500 shown in FIG. 5 includes a capacitor group $C_C$ and an additional capacitor $C_D$. In this embodiment, the capacitor group $C_C$ includes capacitors 541 to 545; however, the present invention is not limited to this example. In an embodiment, a number of the capacitors of the capacitor group $C_C$ is the same as the number of the capacitors of the capacitor group $C_A$. Since the electric characteristic of the capacitor group $C_C$ is similar to that of the capacitor group $C_A$ of FIG. 1, so the detailed description is not repeated.

The additional capacitor $C_D$ is coupled between the input terminal 532 of the control circuit 520 and the comparator circuit 530. Since the characteristic of the additional capacitor $C_D$ is the same as that of the additional capacitor $C_B$ of FIG. 1, so the detailed description is not repeated. The comparator circuit 530 generates the comparison result SO according to the voltages at the input terminals 531 and 532. Since the electric characteristic of the comparator circuit 530 is similar to that of the comparator circuit 130 of FIG. 1, so the detailed description is not repeated.

The control circuit 520 provides appropriate voltages to the capacitor group $C_C$ and the additional capacitor $C_D$ according to the comparison result SO. In the sampling mode, the control circuit 520 provides the same voltage to the input terminals 531 and 532. For example, when the control circuit 520 provides the voltage V1 to the input terminal 531, the control circuit 520 also provides the voltage V1 to the input terminal 532. When the control circuit 520 stops providing the voltage V1 to the input terminal 531, the control circuit 520 stops providing the voltage V1 to the input terminal 532.

Furthermore, in the sampling mode, the control circuit 520 provides the same voltage to the additional capacitors $C_B$ and $C_D$. For example, when the control circuit 520 provides the voltage V1 to the additional capacitor $C_B$, the control circuit 520 provides the voltage V1 to the additional capacitor $C_D$. In this example, when the control circuit 520 provides the voltage V2 to the additional capacitor $C_B$, the control circuit 520 provides the voltage V2 to the additional capacitor $C_D$.

In the sampling mode, the control circuit 520 provides an analog signal Vin1 to the capacitor group $C_A$, and provides other analog signal Vin2 to the capacitor group $C_C$. In an embodiment, the analog signal Vin1 and the analog signal Vin2 form a differential signal pair.

In the data converting mode, the control circuit 520 controls the at least one capacitor of the capacitor group $C_A$ and at least one capacitor of the capacitor group $C_C$ to enter into a floating state. For example, the control circuit 520 controls the capacitors 511 and 541 to enter into the floating state. In other embodiment, the control circuit 520 controls the capacitors 511, 512, 541 and 542 to enter into the floating state. In some embodiments, when the control circuit 520 controls at least one capacitor of the capacitor group $C_A$ and at least one capacitor of the capacitor group $C_C$ to enter into the floating state, and continuously provides the analog signal Vin1 to the other capacitors (such as the capacitors 512 to 515) of the capacitor group $C_A$, and continuously provides the analog signal Vin2 to the other capacitors (such as the capacitor 542 to 545) of the capacitor group $C_C$.

In order to estimate the voltage of the capacitor at the floating state, the control circuit 520 provides appropriate voltage to the capacitor, not entering the floating state, of the capacitor groups $C_A$ and $C_C$. Since the manner used by the control circuit 520 to estimate the voltage of the capacitor entering the floating state is the same as that shown in FIGS. 2D and 2E and FIGS. 3D and 3E, so the detailed description is not repeated.

After estimating the voltage of the capacitor entering the floating state, the control circuit 520 starts to read the voltages of the other capacitors, such as the capacitors not entering the floating state, in a sequential order. At this time, the voltage provided by the control circuit 520 to the capacitor group $C_A$ is opposite to the voltage provided to the capacitor group $C_C$. The capacitor 513 of the capacitor group $C_A$ and the capacitor 543 of the capacitor group $C_C$ are taken as examples, and when the control circuit 520 provides the reference voltage Vref1 to the capacitor 513, the control circuit 520 provides the reference voltage Vref2 to the capacitor 543; when the control circuit 520 provides the reference voltage Vref2 to the capacitor 513, the control circuit 520 provides the reference voltage Vref1 to the capacitor 543.

The circuit architecture of the control circuit 520 of the present invention is not limited to above example, and any circuit architecture capable of providing appropriate voltage to the capacitor groups $C_A$ and $C_C$, the additional capacitor $C_B$ and $C_D$, and the input terminals 531 and 532, can serve as the control circuit 520. In an embodiment, the circuit architecture of the control circuit 520 is similar to the circuit architecture of the control circuit 120 shown in FIG. 1, and the difference between these two embodiments is that the control circuit 520 includes more switches for controlling the voltage of the capacitor group $C_C$, the voltage of the additional capacitor $C_B$, and the voltage at the input terminal 532.

Figure 6:
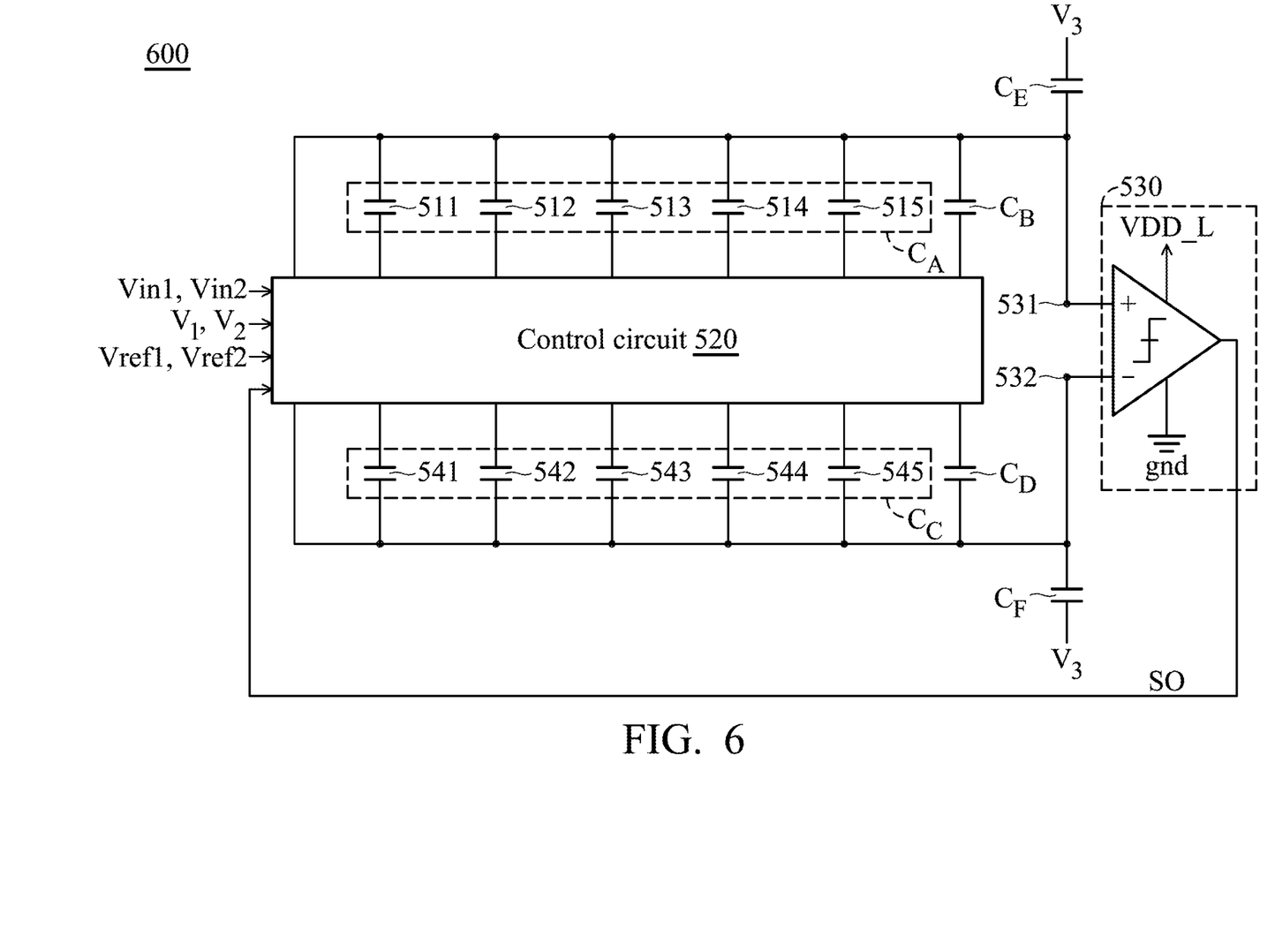
FIG. 6 is a schematic view of other embodiment of a successive approximation register analog-to-digital converter of the present invention.

FIG. 6 is a schematic view of other embodiment of the successive approximation register analog-to-digital converter of the present invention. The embodiment shown in FIG. 6 is similar to the embodiment shown in FIG. 5, and the difference between these two embodiments is that the successive approximation register analog-to-digital converter 600 shown in FIG. 6 includes additional capacitors $C_E$ and $C_F$. The additional capacitor $C_E$ is coupled to the input terminal 531 and receives a voltage V3. The additional capacitor $C_F$ is coupled to the input terminal 532 and receives the voltage V3. In an embodiment, the voltage V3 is about equal to the voltage V2.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A successive approximation register analog-to-digital converter comprising:
 a comparator circuit comprising a first input terminal and a second input terminal, and configured to compare voltages at the first and second input terminals, to generate a comparison result;
 a first capacitor group comprising a plurality of capacitors coupled to the first input terminal;
 a first additional capacitor comprising a first terminal and a second terminal, wherein the first terminal is directly connected to the first input terminal; and
 a control circuit configured to control voltages of the plurality of capacitors and the first additional capacitor according to the comparison result;
 wherein in a first period, the control circuit provides a first voltage to the first input terminal and the second terminal of the first additional capacitor, and provides a first analog signal to the plurality of capacitors of the first capacitor group;
 wherein in a second period, the control circuit stops providing the first voltage to the first input terminal, and controls a first specific capacitor of the first capacitor group to enter into a floating state;
 wherein in a third period, the control circuit provides a second voltage to the second terminal of the first additional capacitor, and the second voltage is lower than the first voltage.

2. The successive approximation register analog-to-digital converter as claimed in claim 1, wherein in the second and third periods, the control circuit provides the first analog signal to the capacitors, other than the first specific capacitor, of the first capacitor group.

3. The successive approximation register analog-to-digital converter as claimed in claim 1, wherein in a fourth period, the control circuit provides a first reference voltage to a second specific capacitor of the first capacitor group, and provides a second reference voltage to the capacitors, other than the first and second specific capacitors, of the first capacitor group, and the comparator circuit generates a first comparison signal according to the voltages at the first and second input terminals.

4. The successive approximation register analog-to-digital converter as claimed in claim 3, wherein according to the first comparison signal, the control circuit provides the first reference voltage or the second reference voltage to the first specific capacitor, provides the first reference voltage to the second specific capacitor, and provides the second reference voltage to the capacitors, other than the first and second specific capacitors, of the first capacitor group, and the comparator circuit generates a second comparison signal according to the voltages at the first and second input terminals.

5. The successive approximation register analog-to-digital converter as claimed in claim 1, wherein according to the second comparison signal, the control circuit provides the first reference voltage or the second reference voltage to the second specific capacitor, provides the first reference voltage to a third specific capacitor of the first capacitor group, and provides the second reference voltage to the capacitors, other than the first, second and third capacitors, of the first capacitor group.

6. The successive approximation register analog-to-digital converter as claimed in claim 1, wherein in the second period, the control circuit controls a second specific capacitor of the first capacitor group to enter into the floating state.

7. The successive approximation register analog-to-digital converter as claimed in claim 6, wherein in the second and third periods, the control circuit provides the first analog signal to the capacitors, other than the first and second specific capacitors, of the first capacitor group.

8. The successive approximation register analog-to-digital converter as claimed in claim 7, wherein in a fourth period, the control circuit provides a first reference voltage to a third specific capacitor of the first capacitor group, and provides a second reference voltage to the capacitors, other than the first, second and third specific capacitors, of the first capacitor group, and the comparator circuit generates a first comparison signal according to the voltages at the first and second input terminals.

9. The successive approximation register analog-to-digital converter as claimed in claim 8, wherein according to the first comparison signal, the control circuit provides the first reference voltage or the second reference voltage to the third specific capacitor, provides the first reference voltage to a fourth specific capacitor of the first capacitor group, and provides the second reference voltage to the capacitors, other than the first, second, third and fourth specific capacitors, of the first capacitor group, and the comparator circuit generates a second comparison signal according to the voltages at the first and second input terminals.

10. The successive approximation register analog-to-digital converter as claimed in claim 9, wherein the control circuit provides the first or second reference voltage to the first specific capacitor according to the first comparison signal, and provides the first or second reference voltage to the second specific capacitor according to the second comparison signal.

11. The successive approximation register analog-to-digital converter as claimed in claim 10, further comprising:
a second capacitor group comprising a plurality of capacitors coupled to the second input terminal; and
a second additional capacitor coupled to the second input terminal;
wherein in the first period, the control circuit provides the first voltage to the second input terminal and the second additional capacitor, and provides a second analog signal to the plurality of capacitors of the second capacitor group;

wherein in the second period, the control circuit stops providing the first voltage to the second input terminal, and controls a fifth specific capacitor of the second capacitor group to enter into the floating state;
wherein in the third period, the control circuit provides the second voltage to the second additional capacitor.

12. The successive approximation register analog-to-digital converter as claimed in claim 11, wherein in the second and third periods, the control circuit provides the second analog signal to the capacitors, other than the fifth specific capacitor, of the second capacitor group.

13. The successive approximation register analog-to-digital converter as claimed in claim 11, wherein in the second period, the control circuit controls a sixth specific capacitor of the second capacitor group to enter into the floating state.

14. The successive approximation register analog-to-digital converter as claimed in claim 13, wherein in the second and third periods, the control circuit provides the second analog signal to the capacitors, other than the fifth and sixth specific capacitors, of the second capacitor group.

15. The successive approximation register analog-to-digital converter as claimed in claim 14, wherein in the fourth period, the control circuit provides a first reference voltage to a seventh specific capacitor of the second capacitor group, and provides the second reference voltage to the capacitors, other than the fifth, sixth and seventh specific capacitors, of the second capacitor group.

16. The successive approximation register analog-to-digital converter as claimed in claim 15, wherein according to the first comparison signal, the control circuit provides the first reference voltage or the second reference voltage to the seventh specific capacitor, provides the first reference voltage to an eighth specific capacitor of the second capacitor group, and provides the second reference voltage to the capacitor, other than the fifth, sixth, seventh and eighth specific capacitors, of the second capacitor group.

17. The successive approximation register analog-to-digital converter as claimed in claim 16, wherein the control circuit provides the first reference voltage or the second reference voltage to the fifth specific capacitor according to the first comparison signal, and provides the first reference voltage or the second reference voltage to the sixth specific capacitor according to the second comparison signal.

* * * * *